(12) United States Patent
Asada et al.

(10) Patent No.: US 9,791,548 B2
(45) Date of Patent: Oct. 17, 2017

(54) PULSE COMPRESSION RADAR

(71) Applicant: Furuno Electric Co., Ltd., Nishinomiya (JP)

(72) Inventors: Yasunobu Asada, Nishinomiya (JP); Takuya Okimoto, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 351 days.

(21) Appl. No.: 14/429,343

(22) PCT Filed: Sep. 10, 2013

(86) PCT No.: PCT/JP2013/074307
§ 371 (c)(1),
(2) Date: Mar. 18, 2015

(87) PCT Pub. No.: WO2014/045926
PCT Pub. Date: Mar. 27, 2014

(65) Prior Publication Data
US 2015/0247920 A1  Sep. 3, 2015

(30) Foreign Application Priority Data

Sep. 19, 2012 (JP) ................................. 2012-206029

(51) Int. Cl.
*G01S 7/28* (2006.01)
*G01S 7/282* (2006.01)
(Continued)

(52) U.S. Cl.
CPC ............ *G01S 7/282* (2013.01); *G01S 7/4004* (2013.01); *G01S 7/4008* (2013.01); *G01S 13/28* (2013.01); *H03F 1/3247* (2013.01); *H03F 3/24* (2013.01)

(58) Field of Classification Search
CPC ...... G01S 7/282; G01S 7/4004; G01S 7/4008; G01S 13/28; H03F 3/24; H03F 1/3247
(Continued)

(56) References Cited

U.S. PATENT DOCUMENTS 3,618,095 A    11/1971  Darlington
4,123,719 A *  10/1978  Hopwood ............... G01S 13/26
                                                          327/5
(Continued)

FOREIGN PATENT DOCUMENTS

DE    102007041669 A1    4/2009
JP    H05341037 A        12/1993
(Continued)

OTHER PUBLICATIONS

V. Perlin and H. G. Winful, "Pulse compression and amplification by stimulated Raman scattering in a nonlinear periodic structure," Conference on Lasers and Electro-Optics (CLEO 2000). Technical Digest. Postconference Edition. TOPS vol. 39 (IEEE Cat. No. 00CH37088), San Francisco, CA, USA, 2000, pp. 151-152.*

(Continued)

*Primary Examiner* — John B Sotomayor
(74) *Attorney, Agent, or Firm* — Alleman Hall Creasman & Tuttle LLP

(57) ABSTRACT

A pulse compression radar for performing pre-distortion is provided, which has a configuration simplified in circuit structure. A radar apparatus (pulse compression radar) includes an antenna configured to externally transmit a transmission signal transmitted by a power amplifier and receive a reflection signal caused thereby as a reception signal. The radar apparatus includes a reception circuit configured to propagate this reception signal to a radar image creating module. The radar apparatus corrects beforehand, by utilizing the transmission signal (feedback signal) transmitted from the power amplifier, a transmission signal to be inputted into the power amplifier so as to cancel distortion of the transmission signal caused by amplification effect of the power amplifier. Further, a circuit where the (Continued)

reception signal passes and a circuit where the feedback signal passes share a part of each other.

20 Claims, 4 Drawing Sheets

(51) Int. Cl.
*G01S 13/28* (2006.01)
*G01S 7/40* (2006.01)
*H03F 1/32* (2006.01)
*H03F 3/24* (2006.01)

(58) Field of Classification Search
USPC .......................................................... 342/189
See application file for complete search history.

(56) References Cited

U.S. PATENT DOCUMENTS

| | | | |
|---|---|---|---|
| 4,600,892 A * | 7/1986 | Wagner | G01S 7/023 327/155 |
| 5,376,938 A | 12/1994 | Martinez et al. | |
| 5,568,150 A * | 10/1996 | Taylor, Jr. | G01S 13/282 342/135 |
| 5,719,579 A * | 2/1998 | Torre | G01S 13/222 342/13 |
| 7,019,686 B2 | 3/2006 | Hester et al. | |
| 2005/0179585 A1* | 8/2005 | Walker | G01S 13/0209 342/134 |
| 2010/0007426 A1* | 1/2010 | Ricketts | H03L 7/099 331/107 T |

FOREIGN PATENT DOCUMENTS

| | | |
|---|---|---|
| JP | 2008303787 A | 11/2006 |
| JP | 2006343131 A | 12/2006 |
| JP | 2007170845 A | 7/2007 |
| JP | 2008190955 A | 8/2008 |

OTHER PUBLICATIONS

European Patent Office, Extended European Search Report Issued in Application No. 13839318.6, dated Jun. 6, 2016, Germany, 8 pages.
ISA Japanese Patent Office, International Search Report of PCT/JP2013/074307, WIPO, dated Nov. 26, 2013, 4 pages.

* cited by examiner

COMPARISON BETWEEN SIGNAL OBTAINED BY PULSE
COMPRESSING TRANSMISSION SIGNAL BEFORE PRE-DISTORTION
AND SIGNAL OBTAINED BY PULSE COMPRESSING IDEAL SIGNAL

COMPARISON BETWEEN SIGNAL OBTAINED BY PULSE
COMPRESSING TRANSMISSION SIGNAL BEFORE PRE-DISTORTION
AND SIGNAL OBTAINED BY PULSE COMPRESSING IDEAL SIGNAL

PULSE COMPRESSION RADAR

TECHNICAL FIELD

This disclosure relates to a pulse compression radar, which performs pre-distortion.

BACKGROUND ART

Conventionally, pulse compression radars which perform processing of transmitting a pulse with a predetermined width and compressing the pulse width in reception are known. With the pulse compression radars, there are cases where a signal amplified by an amplifier (e.g., a power amplifier) is transmitted. However, when the signal is amplified, nonlinear distortion may occur. As a method of correcting the nonlinear distortion, pre-distortion is known.

In the pre-distortion, by feeding back a portion of a signal to be externally transmitted, nonlinear distortion is acquired, and a correction of the signal is performed by taking the distortion into consideration. Specifically, correction data is obtained based on the acquired distortion, and based on the correction data, a transmission signal before being amplified is corrected beforehand so as to obtain an ideal waveform after the amplification by the amplifier. In the above manner, the distortion of the transmission signal can be removed.

Patent Document 1 discloses a transmission apparatus which performs such kind of pre-distortion. Note that, in Patent Document 1, only the transmission apparatus is disclosed and a circuit which receives signals is not described.

A radar apparatus in the conventional radar apparatus referred to above generates a calibration signal by a transmission-side circuit and transmits the calibration signal to a reception-side circuit. Further, the radar apparatus has a configuration in which the reception-side circuit performs calibration based on the calibration signal.

REFERENCE DOCUMENT(S) OF CONVENTIONAL ART

Patent Document(S)

Patent Document 1: JP2006-303787A

DISCLOSURE OF THE INVENTION

Problems to be Solved by the Invention

Meanwhile, in many cases, apparatuses which transmit signals generally have a configuration of receiving the signals (e.g., radar apparatuses). With such kind of apparatuses, in a case of performing the pre-distortion, a pre-distortion circuit needs to be provided in addition to the transmission-side circuit and the reception-side circuit, and the circuit structure becomes complicated.

In this regard, Patent Document 1, as described above, discloses only the transmission circuit and the pre-distortion circuit, and does not point out nor mention about the above problems or solutions thereof.

Note that, with the configuration of the conventional radar apparatus referred to above, no description is given about correcting the transmission signal, and the transmission-side circuit has a configuration of transmitting, not a transmission signal, but the calibration signal to the reception-side circuit. Therefore, the radar apparatus of the conventional radar apparatus referred to above adopts a method significantly different from the pre-distortion method. Therefore, it is obvious that a pre-distortion circuit or any circuit similar to it is not described in the conventional radar apparatus referred to above. In other words, the conventional radar apparatus referred to above does not present a solution nor mention about the above problems.

This disclosure is made in view of the above situations and aims to provide a pulse compression radar for performing pre-distortion, which has a configuration simplified in circuit structure.

Summary and Effects of the Invention

Problems to be solved by the present disclosure are described above, and means for solving the problems and effects thereof will be described below.

According to one aspect of this disclosure, a pulse compression radar having the following configuration is provided. Specifically, the pulse compression radar includes an ideal transmission signal memory, a transmission signal amplifying module, an antenna, a reception circuit, a signal processing module, a signal feedback circuit, and a transmission signal correcting module. The ideal transmission signal memory stores a waveform of a transmission signal before distortion occurs therein (a waveform of an ideal transmission signal). The transmission signal amplifying module amplifies the transmission signal inputted thereto and outputs the amplified transmission signal. The antenna externally transmits the transmission signal outputted from the transmission signal amplifying module, and receives, as a reception signal, a reflection signal caused by the transmission signal. The reception circuit propagates the reception signal received by the antenna. The signal processing module obtains information regarding a target object based on the reception signal inputted thereto via the reception circuit. The signal feedback circuit propagates, as a feedback signal, the transmission signal outputted from the transmission signal amplifying module, to the reception circuit. The transmission signal correcting module corrects the transmission signal so as to cancel the distortion that is caused by the amplification, and outputs the corrected transmission signal to the transmission signal amplifying module, the transmission signal being corrected based on the transmission signal stored in the ideal transmission signal memory and the feedback signal.

Thus, since the pulse compression radar includes the signal feedback circuit, the transmission signal can be propagated by utilizing a part of the reception circuit (the reception circuit and a correction circuit can share at least a part of each other). Therefore, the circuit structure can be simplified and the cost can be lowered by reducing the number of components (e.g., mixers) that perform conversion and the like of the signal.

The pulse compression radar preferably has the following configuration. Specifically, the reception circuit includes a mixer configured to drop a frequency of either one of the feedback signal and the reception signal. Further, the signal feedback circuit is connected with the reception circuit so that the feedback signal is inputted between the mixer and the antenna.

Thus, the dropping of the frequency of the reception signal and the dropping of the frequency of the feedback signal can be performed by the single mixer. Therefore, the cost can be lowered by reducing the number of mixers.

The pulse compression radar preferably has the following configuration. Specifically, the reception circuit includes a reception signal amplifying module configured to amplify the reception signal. Further, the signal feedback circuit is connected with the reception circuit so that the feedback signal is inputted between the reception signal amplifying module and the signal processing module.

Thus, a signal level of the feedback signal is sufficiently high. Therefore, the feedback signal does not require to be amplified more. Moreover, an NF (Noise Figure) can be prevented from becoming unsuitable, by the reception signal amplifying module.

The pulse compression radar preferably has the following configuration. Specifically, the reception circuit includes a limiter configured to suppress a signal based on a signal level thereof. The signal feedback circuit is connected with the reception circuit so that the feedback signal is inputted between the limiter and the signal processing module.

That is, if the feedback signal is inputted into a pre-stage component of the limiter, a situation can be considered where the feedback signal is suppressed. Therefore, by inputting the feedback signal into the post-stage component of the limiter as described above, the above situation can be avoided.

With the pulse compression radar, the reception circuit preferably includes a switch configured to receive the feedback signal and the reception signal received by the antenna and output one of the feedback signal and the reception signal.

Thus, the feedback signal and the reception signal can surely be prevented from being mixed with each other.

The pulse compression radar preferably has the following configuration. Specifically, the switch outputs the feedback signal in the transmission of the transmission signal by the antenna. The switch outputs the reception signal in the reception of the reception signal by the antenna.

Thus, by performing the switching at the switch as described above, the transmission signal (feedback signal) can be outputted to the transmission signal correcting module every time the transmission signal is transmitted, since the transmission of the transmission signal and the reception of the reception signal are normally not performed simultaneously in the radar apparatus. Therefore, the distortion of the transmission signal can be corrected finely.

With the pulse compression radar, the transmission signal amplifying module is preferably a power amplifier.

Thus, the effects of the pulse compression radar of this disclosure can be exerted more effectively, since the power amplifier easily causes the distortion in the transmission signal.

The pulse compression radar preferably has the following configuration. Specifically, the pulse compression radar includes a correction data calculating module configured to calculate correction data that is data for the transmission signal correction module to perform the correction. The correction data calculating module compares the transmission signal stored in the ideal transmission signal memory with the feedback signal, and determines whether to recalculate the correction data based on the comparison result.

Thus, for example, a control becomes available, in which the correction data is updated by newly calculating the correction data when the distortion of the transmission signal is large, and the correction data previously obtained is utilized when the distortion of the transmission signal is small. Therefore, a load on the correction data calculating module can be reduced.

BRIEF DESCRIPTION OF DRAWING(S)

Figure 3A:
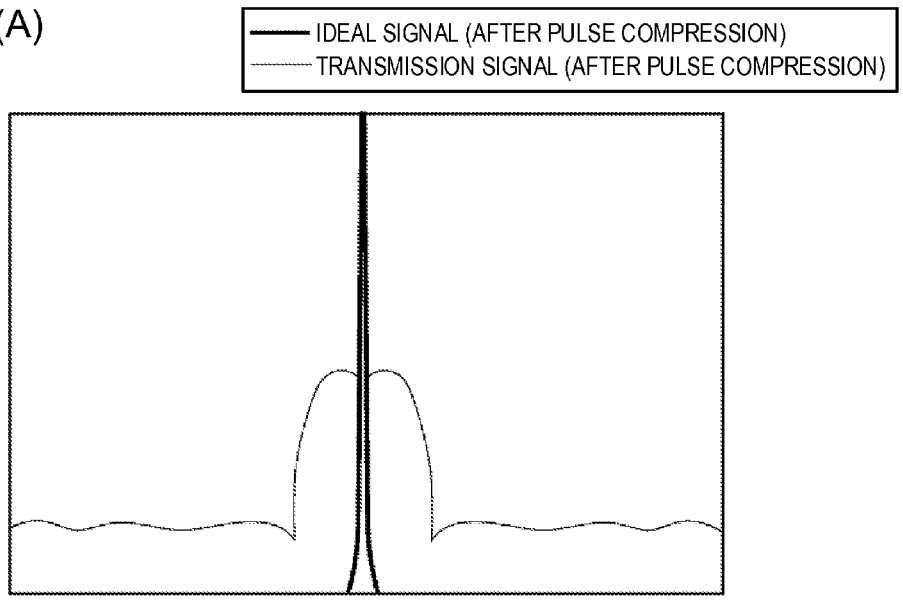
Figure 3B:
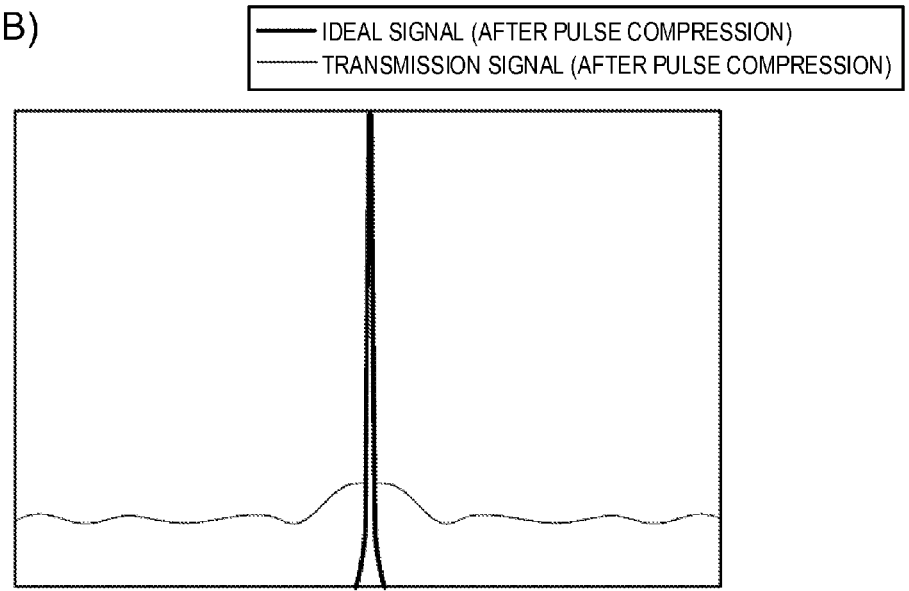

FIGS. 3(A) and 3(B) show charts indicating that distortion of the transmission signal is eliminated by pre-distortion.

Figure 4:
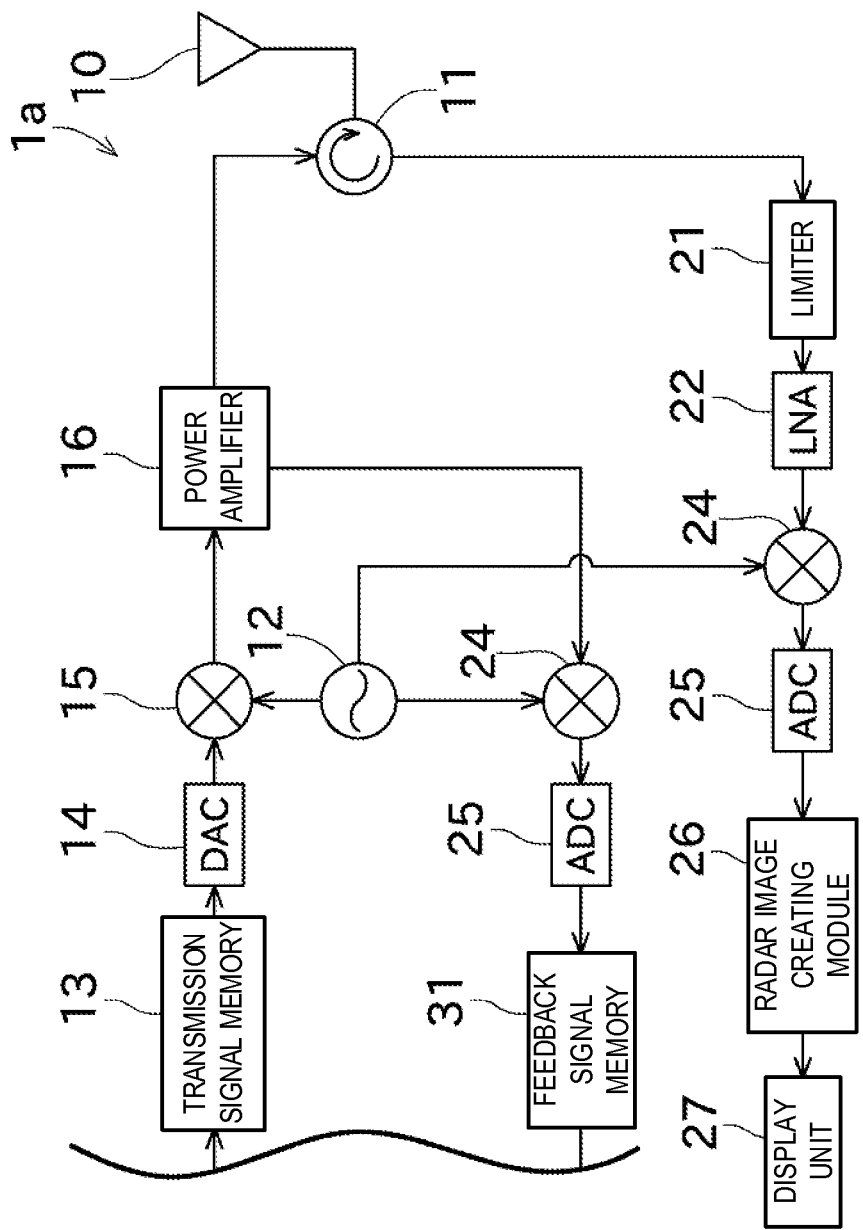

FIG. 4 is a block diagram of a radar apparatus having a configuration without a signal feedback circuit.

MODE(S) FOR CARRYING OUT THE INVENTION

Figure 1:
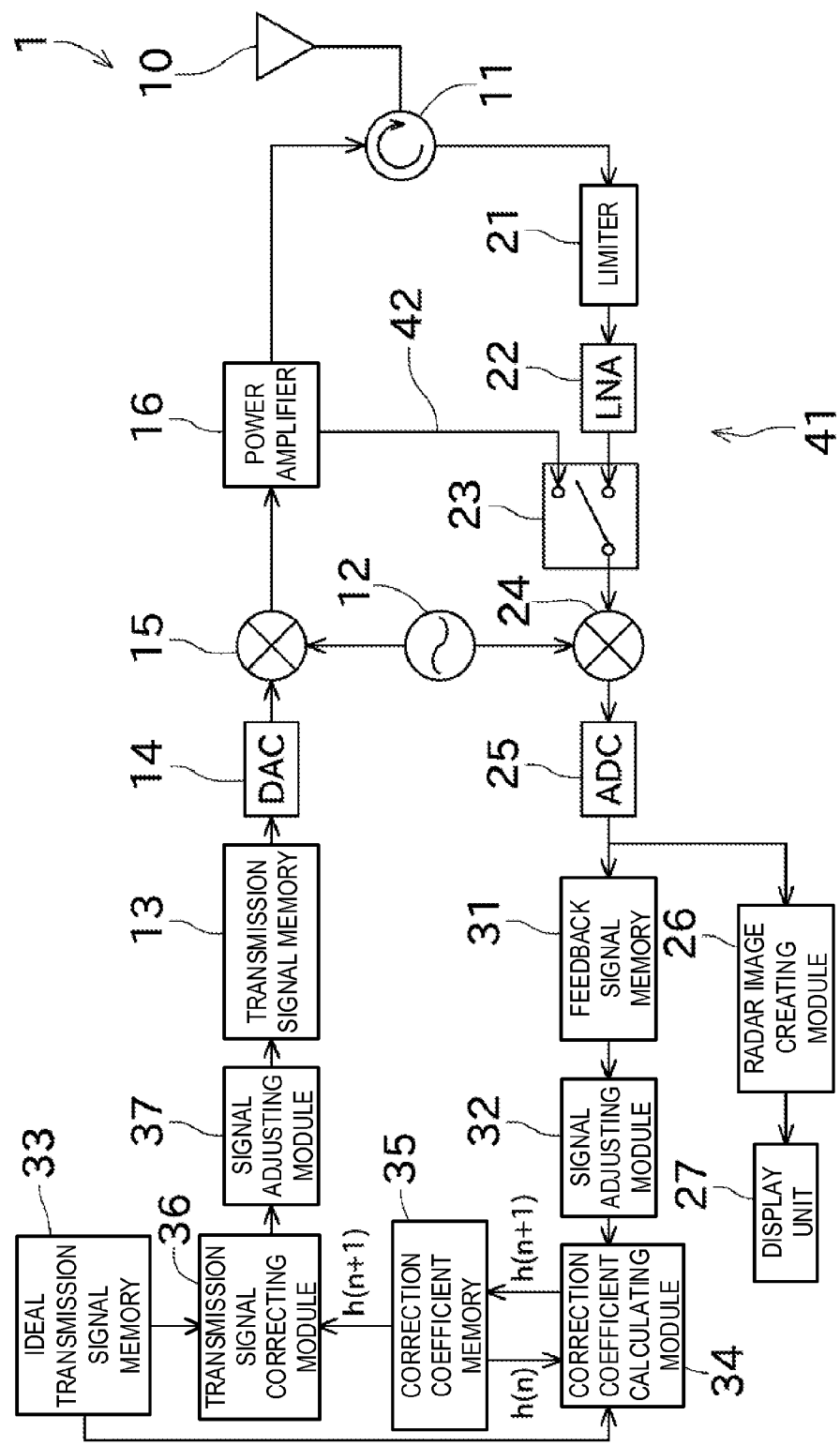
FIG. 1 is a block diagram of a radar apparatus according to one embodiment of this disclosure.

Next, one embodiment of this disclosure is described with reference to the drawings. FIG. 1 is a block diagram of a radar apparatus 1.

The radar apparatus 1 of this embodiment is a type of a pulse compression radar to be installed in a ship, and is detectable of a position and a speed of a target object by transmitting radio waves having a long pulse width and analyzing reception signals of the radio waves. Moreover, the radar apparatus 1 has a configuration of performing the pre-distortion described above. Hereinafter, a detailed configuration of the radar apparatus 1 is described.

The radar apparatus 1 stores a transmission signal that is performed with pre-distortion (the detailed correcting method is described later), in a transmission signal memory 13. Further, when a trigger pulse (transmission trigger) that determines a transmission timing of the transmission signal is generated, the transmission signal stored in the transmission signal memory 13 is outputted (see FIG. 2). As illustrated in FIG. 1, the transmission signal is externally outputted from an antenna 10 through a DAC 14, a mixer 15, a power amplifier (transmission signal amplifier) 16, and a circulator 11.

The DAC 14 converts, from a digital signal into an analog signal, the transmission signal outputted from the transmission signal memory 13, and outputs the converted transmission signal to the mixer 15.

The mixer 15 mixes the transmission signal with a local oscillator signal (local oscillation signal) outputted from a local oscillator 12. Thus, a frequency of the transmission signal can be raised up to a transmission frequency. The mixer 15 outputs the transmission signal of which frequency is raised up, to the power amplifier 16.

The power amplifier 16 amplifies the transmission signal and externally outputs it from the antenna 10 through the circulator 11. Note that, due to the transmission signal being amplified by the power amplifier 16, nonlinear distortion may occur in the transmission signal. However, in this embodiment, since the transmission signal corrected (performed with the pre-distortion) by taking the distortion into consideration is inputted into the power amplifier 16, the radio wave without (with small) nonlinear distortion is transmitted as the transmission signal.

Note that, the transmission signal outputted from the power amplifier 16 is also outputted to a switch 23 via a signal feedback circuit 42. The transmission signal outputted to the switch 23 (feedback signal) is utilized for performing the pre-distortion.

The antenna 10 is configured to transmit the transmission signal as described above and receive, as the reception signal, a reflection signal caused by the transmission signal reflected on the target object (echo source) and returned therefrom. Moreover, the antenna 10 is configured to repeat the transception of the radio waves while rotating on the horizontal plane at a predetermined rotational speed. By the above configuration, the antenna 10 is scannable over 360° within the horizontal plane centering on the ship and acquirable of a state of the target object in the surroundings.

The circulator 11 is suitably switchable of a path of the signal such that the transmission signal with high energy from the power amplifier 16 is not inputted into a reception-side circuit and the reception signal is appropriately inputted into the reception-side circuit.

Next, a configuration of processing the reception signal received by the antenna 10 is described. The reception signal, after passing through the circulator 11, passes through a limiter 21, an LNA (Low Noise Amplifier, reception signal amplifier) 22, the switch 23, a mixer 24, and an ADC 25. Then, a radar image is created by a radar image creating module (signal processing module) 26, and the radar image is displayed on a display unit 27. Note that, in the following description, the path where the reception signal passes may be referred to as the reception circuit 41. Hereinafter, the respective components are described.

The limiter 21 prevents a signal with extremely high level from flowing into the post-stage components. The limiter 21 suppresses a signal with a predetermined signal level or higher, for example.

The LNA 22 performs processing of amplifying the signal level of the reception signal. By passing through the LNA 22, the signal level of weak reception signal can be amplified to the extent that the post-stage processing can be performed.

The switch 23 receives the reception signal outputted from the LNA 22 and the feedback signal outputted from the power amplifier 16. The switch 23 outputs one of these signals to the mixer 24 which is at the post-stage of the switch 23.

Figure 2:
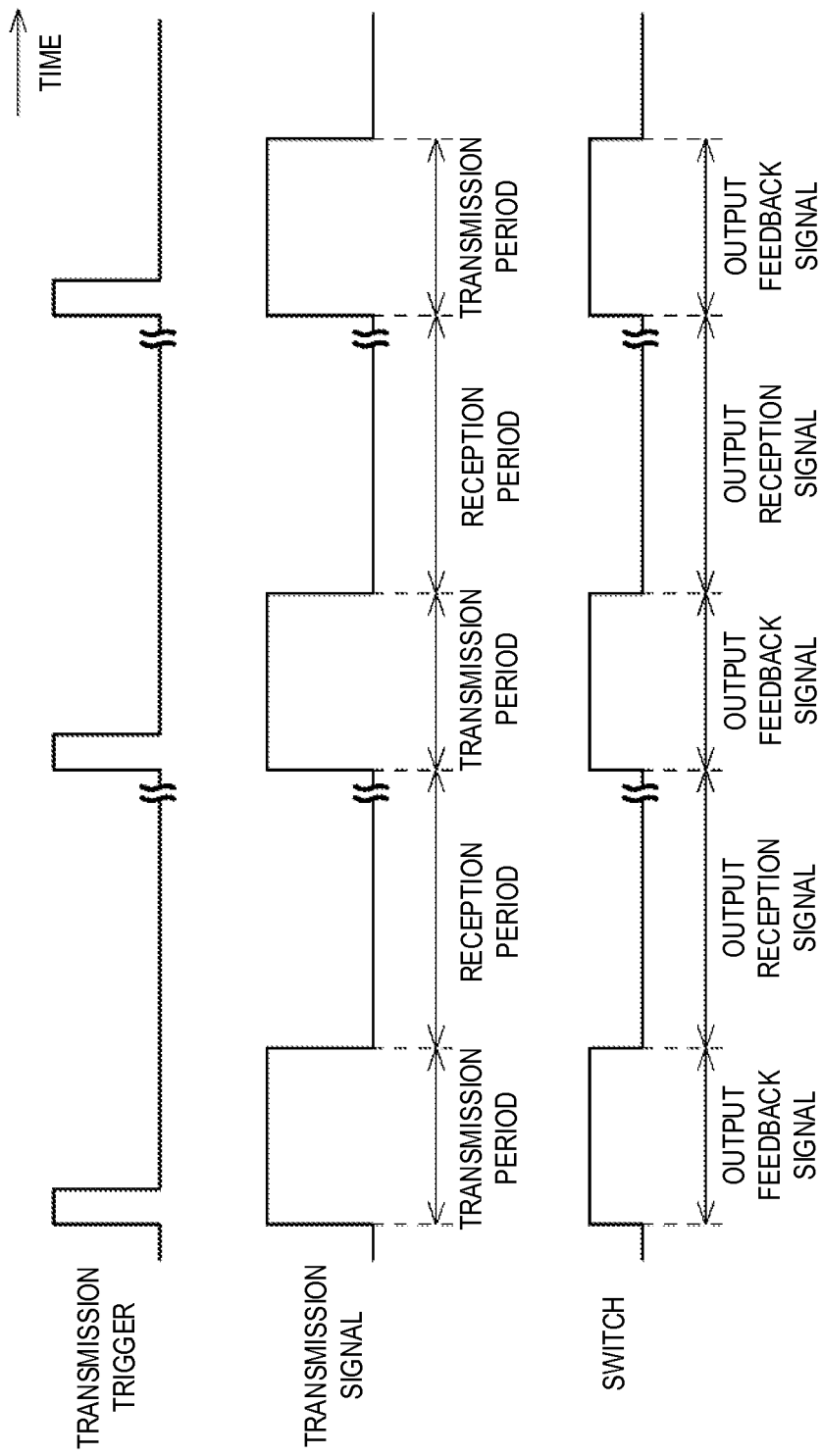
FIG. 2 is a timing chart of a transmission trigger, a transmission signal, and a switch.

As illustrated in FIG. 2, the switching timing of the switch 23 depends on a transmission timing of the transmission signal of the radar apparatus 1. In other words, the radar apparatus 1 switches, at a predetermined timing, a transmission period of transmitting the transmission signal and a reception period of receiving the reflection signal therebetween, and the radar apparatus 1 does not perform the transmission and the reception in parallel to each other. Further, when the radar apparatus 1 is in the transmission period, the switch 23 outputs the feedback signal to the mixer 24. On the other hand, when the radar apparatus 1 is in the reception period, the switch 23 outputs the reception signal to the mixer 24. Thus, even in the case where the feedback signal and the reception signal pass through the same path, the signals can be prevented from being mixed with each other.

The mixer 24, similar to the mixer 15, is able to drop the frequency of either one of the feedback signal and the reception signal, by mixing the either one of the feedback signal and the reception signal with the local oscillation signal of the local oscillator 12. The mixer 24 outputs the either one of the feedback signal and the reception signal of which the frequency is dropped, to the ADC 25.

The ADC 25 converts the either one of the feedback signal and the reception signal, from an analog signal into a digital signal. The ADC 25 outputs the feedback signal to a feedback signal memory 31 and outputs the reception signal to the radar image creating module 26.

By taking the transmission signal and the like into consideration, the radar image creating module 26 performs pulse compression on the reception signal inputted from the ADC 25 and creates the radar image based on the pulse-compressed signal. Specifically, the radar image creating module 26 obtains a distance to the target object from the antenna 10 based on a time difference between the timing at which the antenna 10 transmits the transmission signal and the timing at which the reflection signal is received. Moreover, the radar image creating module 26 acquires a direction of the target object based on a rotational phase (facing direction) of the antenna 10. In the above manner, the radar image creating module 26 creates the radar image.

The display unit 27 includes a liquid-crystal display, and is displayable of the radar image created by the radar image creating module 26.

Next, a configuration of performing the pre-distortion is described.

As the configuration of performing the pre-distortion, the radar apparatus 1 includes the feedback signal memory 31, a signal adjusting module 32, an ideal transmission signal memory 33, a correction coefficient calculating module (correction data calculating module) 34, a correction coefficient memory 35, a transmission signal correcting module 36, and a signal adjusting module 37.

As described above, the feedback signal memory 31 receives the feedback signal outputted from the switch 23. Although the feedback signal memory 31 receives the feedback signal every time the transmission signal is transmitted, the feedback signal is not updated while the correction coefficient calculating module 34 and the like perform the pre-distortion. Thus, even in a case where pre-distortion using a certain feedback signal has not yet completed but the next feedback signal is inputted into the feedback signal memory 31, the correction with the currently-used feedback signal can be performed.

The signal adjusting module 32 adjusts the feedback signal so as to suitably perform the pre-distortion by the correction coefficient calculating module 34 and the like. The signal adjusting module 32 performs, for example, processing of adjusting an amplitude and phase of the feedback signal so as to perform comparison. The feedback signal after the signal adjustment by the signal adjusting module 32 is outputted to the correction coefficient calculating module 34.

The ideal transmission signal memory 33 stores an ideal transmission signal (the transmission signal before distortion occurs, a reference signal, hereinafter referred to as the ideal signal) to be transmitted from the antenna 10 (specifically, stores a waveform of the ideal signal). The ideal signal is outputted to the correction coefficient calculating module 34.

The correction coefficient calculating module 34 receives the feedback signal after the adjustment and the ideal signal. The correction coefficient calculating module 34 calculates a correction coefficient required for the pre-distortion based on both of the signals. The correction coefficient is a coefficient quantitatively indicating a difference between the feedback signal and the ideal signal. In this embodiment, the correction coefficient calculating module 34 calculates a correction coefficient h(n) by performing operation of the following Equation (1).

$$h_n = h_{n-1} + \mu h_{n-1}(x-y)\bar{y} \qquad (1)$$

Here, x is the ideal signal, y is the feedback signal, and μ is a step size. The step size is a coefficient that determines responsiveness (followability). Moreover, the current correction coefficient h(n) is obtained based on a correction coefficient h(n−1) obtained immediately previously. In other words, the correction coefficient calculating module 34 updates the correction coefficient over time by taking previous and current situations into consideration. Note that, the immediately-previous correction coefficient h(n−1) is stored by the correction coefficient memory 35.

Here, how much the previous situation is taken into consideration is determined by μ (step size). If the step size is large, the current situation is prioritized, and thus, the difference between the ideal signal and the feedback signal can be rapidly corrected; however, the correction coefficient may diverge. On the other hand, if the step size is small, the possibility of the correction coefficient diverging is low; however, the difference between the ideal signal and the feedback signal cannot be rapidly corrected. The step size is determined by taking the above factors into consideration.

The correction coefficient calculating module 34 determines the correction coefficient as described above and outputs the correction coefficient to the transmission signal correcting module 36. Moreover, the correction coefficient memory 35 stores a correction coefficient newly obtained by the correction coefficient calculating module 34 (updates the correction coefficient).

The transmission signal correcting module 36 generates the transmission signal by adding predetermined distortion to the ideal signal beforehand through using the correction coefficient. The transmission signal generated by the transmission signal correcting module 36 is outputted to the signal adjusting module 37.

The signal adjusting module 37 adjusts, in corresponding with the DAC 14 which is at the post-stage thereof, a rate of the transmission signal and adjusts the amplitude of the transmission signal. The transmission signal adjusted by the signal adjusting module 37 is stored in the feedback signal memory 31.

The transmission signal stored in the feedback signal memory 31 is outputted in response to the transmission trigger as described above, amplified by the power amplifier 16, and then externally outputted.

Here, the transmission signal inputted into the power amplifier 16 is already performed with the pre-distortion (distorted beforehand) by the transmission signal correcting module 36. Therefore, due to the distortion caused by the power amplifier 16, the distortions cancel each other and the waveform of the transmission signal is approximated to the ideal signal.

With the radar apparatus 1 of this embodiment, the pre-distortion is performed as described above. Note that, when the feedback signal is newly inputted into the correction coefficient calculating module 34 and the like, they re-obtain the correction coefficient based on the feedback signal. The transmission signal correcting module 36 corrects the transmission signal by using the newly obtained correction coefficient. By repeating the pre-distortion as above, the distortion included in the transmission signal can be removed highly accurately.

FIG. 3(A) and 3(B) schematically illustrate data indicating that the distortion of the transmission signal is eliminated by the pre-distortion. FIG. 3(A) is a chart in which a signal obtained by pulse compressing the transmission signal without being performed with the pre-distortion is compared with a signal obtained by pulse compressing the ideal signal. FIG. 3(B) is a chart in which a signal obtained by pulse compressing the transmission signal which is performed with the pre-distortion a sufficient number of times is compared with the signal obtained by pulse compressing the ideal signal. In the signal obtained by pulse compressing the transmission signal in FIG. 3(A), deterioration of directivity is caused by influence of the distortion. On the other hand, such deterioration is hardly seen in the signal obtained by pulse compressing the transmission signal in FIG. 3(B). In other words, the distortion of the transmission signal can be removed by the processing of this embodiment.

Next, advantages in providing the signal feedback circuit 42 are described. FIG. 4 is a block diagram of a radar apparatus 1a having a configuration without the signal feedback circuit 42.

With the configuration without the signal feedback circuit 42, as illustrated in FIG. 4, in addition to the mixer 24 and the ADC 25 for the pre-distortion circuit, a mixer 24 and an ADC 25 for a radar image creation circuit are required. On the other hand, in this embodiment, the configuration in which the pre-distortion circuit and the radar image creation circuit share a part of each other is provided. Therefore, the mixer 24 and the ADC 25 can be shared between both of the circuits. Thus, compared to the configuration in FIG. 4, the number of the mixers and the ADCs can be reduced and, therefore, the cost can be lowered.

Moreover, with the configuration in FIG. 4, since the local oscillation signal of the local oscillator 12 needs to be transmitted to three components, there is a possibility that the circuit structure becomes complicated. On the other hand, in this embodiment, since the local oscillation signal of the local oscillator 12 only needs to be transmitted to two components, the wiring can be implemented while effectively utilizing the space of the radar apparatus 1, and the circuit structure can be simplified. Further, in this embodiment, since the feedback signal is inputted into the post-stage component of the LNA 22, an NF can be reduced.

Next, a control of reducing the load of the operation performed by the correction coefficient calculating module 34 is described. The operation of calculating the correction coefficient causes a comparatively high load, and therefore, a control can be performed as follows to have a configuration in which the correction coefficient is only calculated when necessary. Hereinafter, the control is described in detail.

When this control is performed, the correction coefficient calculating module 34 compares the ideal signal with the feedback signal before calculating the correction coefficient and determines whether both of the signals are approximated. Further, if the correction coefficient calculating module 34 determines that both of the signals are approximated, the distortion of the transmission signal is considered to be sufficiently removed and does not calculate the correction coefficient. In this case, the transmission signal correcting module 36 performs the pre-distortion by using the previously-obtained correction coefficient.

On the other hand, if the correction coefficient calculating module 34 determines that both of the signals are not approximated, the distortion of the transmission signal is considered to be not sufficiently removed and calculates the correction coefficient. In this case, the transmission signal correcting module 36 performs the pre-distortion by using the newly-obtained correction coefficient.

By performing the above control, the load on the correction coefficient calculating module 34 can be reduced. Note that, the comparison between the signals is not necessarily performed every time the feedback signal is inputted, and for example, when the both of the signals are approximated, the signals may be compared every predetermined number of times the feedback signal is inputted.

As described above, the radar apparatus 1 includes the ideal transmission signal memory 33, the power amplifier 16, the antenna 10, the reception circuit 41, the radar image creating module 26, the signal feedback circuit 42, and the transmission signal correcting module 36. The ideal transmission signal memory 33 stores the transmission signal before the distortion occurs therein. The power amplifier 16 amplifies the transmission signal inputted thereto and outputs the amplified transmission signal. The antenna 10 externally transmits the transmission signal outputted from the power amplifier 16, and receives, as the reception signal, the reflection signal of the transmission signal. The reception circuit 41 propagates the reception signal received by the antenna 10. The radar image creating module 26 obtains the information regarding the target object based on the reception signal inputted thereto via the reception circuit (specifically, the radar image). The signal feedback circuit 42 propagates the transmission signal outputted from the power amplifier 16, to the reception circuit 41. The transmission signal correcting module 36 corrects beforehand the transmission signal to be inputted into the power amplifier 16 (corrects the transmission signal and outputs it to the power amplifier (transmission signal amplifier) 16) so as to cancel the distortion which will occur by the amplification, based on the ideal signal and the feedback signal.

Thus, since the radar apparatus 1 includes the signal feedback circuit 42, the transmission signal can be propagated by utilizing a part of the reception circuit 41 (the reception circuit and the correction circuit can share at least a part of each other). Therefore, the circuit structure can be simplified and the cost can be lowered by reducing the number of components that perform conversion and the like of the signal (the mixer 24 and the ADC 25).

Although the suitable embodiment of this disclosure is described above, the above configurations may be modified as follows, for example.

The signal amplifier is not limited to the power amplifier 16, and any component may be used as long as there is a possibility of causing distortion in the transmission signal.

The correction data calculating module (correction coefficient calculating module 34) may have any configuration as long as the correction data required for performing the pre-distortion is calculated, and the correction data may be calculated by a method other than. Equation (1). Moreover, the correction data calculating module does not necessarily calculate the "coefficient," and may have any configuration as long as some sort of data required for the correction is calculated. Note that, the storing target of the correction coefficient memory 35 is also similarly not limited to the correction coefficient.

The signal processing module (radar image creating module 26) may have any configuration as long as the information regarding the target object is obtained, and may have a configuration of obtaining only the position of the target object without creating the radar image.

The configuration illustrated in the block diagram of FIG. 1 is an example, and as long as the configuration of this disclosure is provided, suitable addition, omission, change in position and the like of the components may be implemented. For example, a configuration in which a high-pass filter is provided at a post-stage of the ADC 25 may be provided.

This disclosure is not limited to the radar apparatus for ships, and is applicable to radar apparatuses to be installed in other movable bodies, such as aircrafts. Moreover, other than the application to be installed in the movable bodies, it is applicable to radar apparatuses for ship course surveillance.

DESCRIPTION OF REFERENCE NUMERAL(S)

1 Radar Apparatus (Pulse Compression Radar)
13 Transmission Signal Memory
16 Power Amplifier (Transmission Signal Amplifier)
21 Limiter
22 LNA (Reception Signal Amplifier)
23 Switch
24 Mixer
25 ADC
26 Radar Image Creating Module (Signal Processing Module)
31 Feedback Signal Memory
33 Ideal Transmission Signal Memory
34 Correction Coefficient Calculating Module (Correction Data Calculating Module)
35 Correction Coefficient Memory
36 Transmission Signal Correcting Module
41 Reception Circuit
42 Signal Feedback Circuit

The invention claimed is:

1. A pulse compression radar, comprising:
an ideal transmission signal memory configured to store a transmission signal before distortion occurs therein;
a transmission signal amplifier configured to amplify the transmission signal inputted thereto and output an amplified transmission signal;
an antenna configured to externally transmit the amplified transmission signal outputted by the transmission signal amplifier, and receive, as a reception signal, a reflection signal caused by the amplified transmission signal;
a reception circuit configured to receive the reception signal from the antenna and propagate the reception signal received from the antenna to an analog-to-digital converter at a post-stage of the reception circuit;
processing circuitry configured to obtain information regarding a target object based on the reception signal inputted thereto via the reception circuit and via the analog-to-digital converter; and
a signal feedback circuit configured to propagate, as a feedback signal, the amplified transmission signal outputted by the transmission signal amplifier, to the reception circuit;
wherein the processing circuitry is further configured to correct the amplified transmission signal so as to cancel the distortion that is caused by the amplification, and output a corrected transmission signal to the transmission signal amplifier, the amplified transmission signal being corrected based on the transmission signal stored in the ideal transmission signal memory and the feedback signal.

2. The pulse compression radar of claim 1, wherein the reception circuit includes a mixer configured to drop a frequency of either one of the feedback signal and the reception signal, and
wherein the signal feedback circuit is connected with the reception circuit so that the feedback signal is inputted between the mixer and the antenna.

3. The pulse compression radar of claim 1, wherein the reception circuit includes a reception signal amplifier configured to amplify the reception signal, and
wherein the signal feedback circuit is connected with the reception circuit so that the feedback signal is inputted between the reception signal amplifier and the processing circuitry.

4. The pulse compression radar of claim 1, wherein the reception circuit includes a limiter configured to suppress a signal based on a signal level thereof, and
wherein the signal feedback circuit is connected with the reception circuit so that the feedback signal is inputted between the limiter and the processing circuitry.

5. The pulse compression radar of claim 1, wherein the reception circuit includes a switch configured to receive the feedback signal and the reception signal received by the antenna and alternately output one of the feedback signal and the reception signal.

6. The pulse compression radar of claim 5, wherein the switch alternately outputs the feedback signal during the transmission of the amplified transmission signal by the antenna, and the reception signal during the reception of the reception signal by the antenna.

7. The pulse compression radar of claim 1, wherein the transmission signal amplifier is a power amplifier.

8. The pulse compression radar of claim 1, wherein the processing circuitry is further configured to calculate correction data that is data for performing the correction,
wherein the processing circuitry compares the transmission signal stored in the ideal transmission signal memory with the feedback signal, and determines whether to recalculate the correction data based on the comparison result.

9. The pulse compression radar of claim 2, wherein the reception circuit includes a reception signal amplifier configured to amplify the reception signal, and
wherein the signal feedback circuit is connected with the reception circuit so that the feedback signal is inputted between the reception signal amplifier and the processing circuitry.

10. The pulse compression radar of claim 9, wherein the reception circuit includes a limiter configured to suppress a signal based on a signal level thereof, and
wherein the signal feedback circuit is connected with the reception circuit so that the feedback signal is inputted between the limiter and the processing circuitry.

11. The pulse compression radar of claim 10, wherein the reception circuit includes a switch configured to receive the feedback signal and the reception signal received by the antenna and alternately output one of the feedback signal and the reception signal.

12. The pulse compression radar of claim 11, wherein the switch alternately outputs the feedback signal during the transmission of the transmission signal by the antenna, and the reception signal during the reception of the reception signal by the antenna.

13. The pulse compression radar of claim 12, wherein the transmission signal amplifier is a power amplifier.

14. The pulse compression radar of claim 13, wherein the processing circuitry is further configured to calculate correction data that is data for performing the correction,
wherein the processing circuitry compares the transmission signal stored in the ideal transmission signal memory with the feedback signal, and determines whether to recalculate the correction data based on the comparison result.

15. The pulse compression radar of claim 2, wherein the reception circuit includes a limiter configured to suppress a signal based on a signal level thereof, and
wherein the signal feedback circuit is connected with the reception circuit so that the feedback signal is inputted between the limiter and the processing circuitry.

16. The pulse compression radar of claim 2, wherein the reception circuit includes a switch configured to receive the feedback signal and the reception signal received by the antenna and alternately output one of the feedback signal and the reception signal.

17. The pulse compression radar of claim 2, wherein the transmission signal amplifier is a power amplifier.

18. The pulse compression radar of claim 2 wherein the processing circuitry is further configured to calculate correction data that is data for performing the correction,
wherein the processing circuitry compares the transmission signal stored in the ideal transmission signal memory with the feedback signal, and determines whether to recalculate the correction data based on the comparison result.

19. The pulse compression radar of claim 3, wherein the reception circuit includes a limiter configured to suppress a signal based on a signal level thereof, and
wherein the signal feedback circuit is connected with the reception circuit so that the feedback signal is inputted between the limiter and the processing circuitry.

20. The pulse compression radar of claim 3 wherein the reception circuit includes a switch configured to receive the feedback signal and the reception signal received by the antenna and alternately output one of the feedback signal and the reception signal.

* * * * *